CIRCUIT STRUCTURE

Original Filed Dec. 13, 1965

INVENTORS
SEYMOUR MERRIN
MELVYN D. SILVER
EDWARD M. SUDEN

BY Joseph L. Spiegel
ATTORNEY

United States Patent Office 3,508,118

Patented Apr. 21, 1970

3,508,118

CIRCUIT STRUCTURE

Seymour Merrin, Fairfield, Conn., and Melvyn D. Silver and Edward M. Suden, Suitland, Md., assignors to International Business Machines Corporation, Armonk, N.Y., a corporation of New York Original application Dec. 13, 1965, Ser. No. 513,412, now Patent No. 3,436,818, dated Apr. 8, 1969. Divided and this application Jan. 24, 1969, Ser. No. 794,014

Int. Cl. H011 *19/00*

U.S. Cl. 317—101 6 Claims

ABSTRACT OF THE DISCLOSURE

A microminiature circuit structure includes a substrate having a plurality of connecting areas. A microminiature chip device having a face with solder wettable terminal areas is bonded to the substrate by means of a plurality of connectors which establish a unified joint between terminal and connecting areas. The connectors are made of a solder which will only partially wet the connecting areas.

Cross reference to related application

This application is a divisional application of Ser. No. 513,412, filed Dec. 13, 1965, now U.S. Patent 3,436,818 issued Apr. 8, 1969.

Background of the invention

This invention relates to a bonded joint and in particular to circuit structures employing bonded joints between first and second objects, typically, a microminiature chip device and a printed circuit board or dielectric substrate.

Many information handling systems are based upon a plurality of "building block" circuits which are conveniently interconnected to perform any desired logic function, for example, arithmetic, data storage and the like. One approach to the fabrication of such building blocks is to microminiaturize individual active and passive devices and fasten them to a miniaturized substrate. This approach, generally referred to as microminiaturized circuitry, is discussed briefly in the periodical "Electronics" published by McGraw-Hill, Feb. 15, 1963 at pages 45–60.

In microminiaturized circuits passive devices such as resistors, and active devices or "chips" such as transistors and/or diodes are secured to substrates of the order of 0.45" x 0.45" x 0.06". The chips, as one example, which are to be secured to the substrate are of the order of .028" x .028" and interconnection of these chips to the substrate is a particular problem. For a connection or bonded joint to be rated acceptable, it must have sufficient strength to withstand normal shock and vibration associated with information handling systems. Its electrical and mechanical characteristics must not deteriorate or change under extreme humidity conditions normally associated with such systems. Additionally, the interconnection must not short circuit to the semiconductor body. The bonded joint should also have a melting point sufficiently high that it will not be affected during any soldering of the substrate to a supporting card. Finally, the bonding materials should not produce a doping action in the chip device.

One satisfactory bonding technique is described in more detail in a copending application entitled "Method of and Apparatus for Fabricating Microminiature Functional Components," by R. D. McNutt et al., Ser. No. 300,855, filed Aug. 8, 1963, and assigned to the same assignee as the present invention, now U.S. Patent 3,292,240, issued Dec. 20, 1966. In this application, a unique metallic circuit pattern is printed on a supporting dielectric substrate, typically ceramic. The pattern is coated with a suitable solder having a first eutectic temperature such as 90% lead, 10% tin solder with a eutectic temperature of 305° C. The chips to be attached to the substrate are each provided with built up metallic contacts, typically spherical, but having a second eutectic temperature which exceeds that of the solder such as 75–25% gold-antimony alloy with a eutectic temperature of 360° C. The pattern is fluxed at locations where chips are to be positioned. Subsequently, the chips are placed in their proper position with the flux, such as a non-corrosive, water white rosin fluid, acting as a glue to retain the chips in position. The substrate is placed in a conventional furnace and fired until the substrate reaches a temperature between the respective eutectic temperatures to melt the solder on the pattern with little or no effect on the contact shape. Solder fillets extend up the sides of the contacts and fuse the device to the pattern thereby providing good electrical and mechanical interconnection. The retention of contact shape positively spaces the chip from the substrate.

In another copending application entitled "Terminals for Microminiaturized Devices and Methods of Connecting Same to Circuit Panels," by I. M. Hymes, Ser. No. 333,863, filed Dec. 27, 1963, and assigned to the same assignee as the present invention, now U.S. Patent 3,303,-393, issued Feb. 7, 1967, the metallic contacts, typically copper balls, are of a wettable material, i.e. solder adherent, which is substantially unaffected at temperatures required for melting the solder on the pattern. The temperature insensitivity of the contacts permits joining to be effected without precise control of temperature conditions.

In still another copending application entitled "Solder Method for Providing Standoff of Device from Substrate," by J. Napier et al., Ser. No. 466,625, filed June 24, 1965 and assigned to the same assignee as the present invention, now U.S. Patent 3,392,442, issued July 12, 1968, the pattern is provided with a coating of lead-rich lead-tin solder that exhibits a relatively high liquidus temperature. The chip is provided with substantially hemispherical lead-tin solder contacts having a liquidus temperature less than that of the pattern solder coat. The contacts are placed on the solder coat and heated above the eutectic temperature of the contacts but below the solidus temperature of the solder coating on the pattern. A cross diffusion of lead and tin occurs which causes the contacts to become lead rich and solidify. While this is occurring, the contacts' surface tension maintains their shape thereby providing the required standoff simultaneously with the production of the desired electrical and mechanical bond. This technique has the virtue that the bond is relatively soft and thus the chips can be probed without shock transmittal damage.

In a further copending application entitled "Circuit Structure and Method," by L. F. Miller, Ser. No. 465,034, filed June 18, 1965, and assigned to the same assignee as the present invention, now U.S. Patent 3,429,040 issued Feb. 25, 1969 an electrically conductive pattern which is not wettable with solder is applied to a substrate. Wettable with solder conducting connecting areas are applied to or contiguous with the nonwettable pattern. Solder is then applied to these connecting areas and the solder contacts of chips are positioned over the solder coated connecting area. The substrates are placed in an oven and heated until the solder balls on the chips and the solder on the connecting areas form a unified solder mass. The solder contacts substantially retain their shape because the areas immediately surrounding the connecting areas are not wettable by solder.

It is to be noted that in each of the above applications the conductive pattern, or at least preselected connecting areas on or contiguous with the pattern are coated with solder prior to placing the chip contacts thereon. The coating of the pattern with solder has been found necessary for establishing the bonded joint and for decreasing resistivity of the pattern. It was also felt necessary to provide adequate thermal conductivity. However, the coating of the pattern with solder represents an additional step in fabricating the bonded joint, necessitating still other fabrication steps such as cooling, cleaning, inspection and the like. Further, the solder coating will attack the underlying pattern.

Accordingly, a general object of the present invention is a circuit structure providing mechanical and electrical interconnection between a microminiature chip device and dielectric substrate while otherwise providing positive standoff therebetween.

Another object is a circuit structure in which chip devices are bonded to a conductive pattern on a dielectric substrate without the necessity for precoating the pattern with solder.

These and other objects are accomplished in accordance with the present invention, one illustrative embodiment of which comprises providing a dielectric supporting substrate with an electrically conductive pattern such as copper having a plurality of connecting areas. A microminiature chip device is provided with contacts extending therefrom of a solder such as 97½% lead, 2½% tin which will only partially wet the copper pattern. The chip contacts are gently placed onto the connecting areas. The substrate holding the microminiature component is then heated in a non-reducing atmosphere for a time and to a temperature at which the solder melts. The molten solder is maintained in shape, first because of its own surface tension, secondly because of the partial wettability of the solder for the pattern material, thirdly because of an oxide forming on the immediate area surrounding the interconnection which inhibits the flow of solder along the pattern surface away from the interconnection, and fourthly because of the diffusion of a slight amount of copper into the solder raising its melting point and causing it to partially solidify. (By partial wettability, it is meant that the solder will wet the conductive pattern in the region of placement so as to form a connection but not readily flow away from the region so as to permit chip collapse.) The solder connection is then allowed to cool to completely solidify. Thus, the chip is mechanically and electrically connected to the copper pattern on the dielectric substrate, while elsewhere positive standoff is maintained between chip and pattern.

A feature of this invention is a circuit structure employing a connection between a microminiature chip device and a dielectric supporting substrate comprising one or more solder contacts extending from the chip device and a conductive pattern adhered to the substrate, the chip device being fused through the contacts to the pattern, the contacts positively spacing the chip device from the substrate.

The foregoing and other objects, features and advantages of the invention will be apparent from the following more particular description of a preferred embodiment of the invention, as illustrated in the accompanying drawing.

Figures 2, 2A:
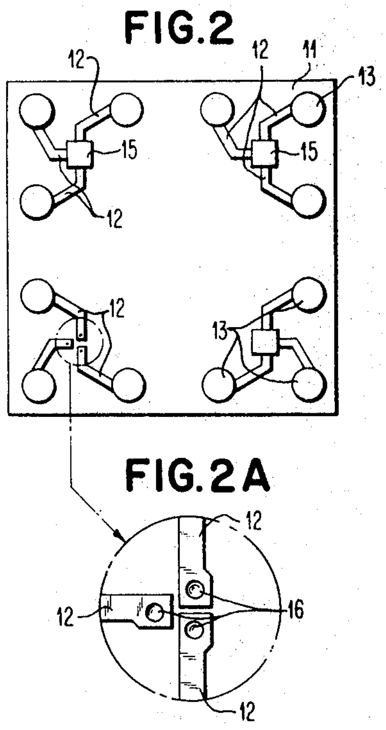
FIGURE 2 is a plan view of a microelectronic dielectric substrate with a conductive pattern formed thereon.
Figure 3:
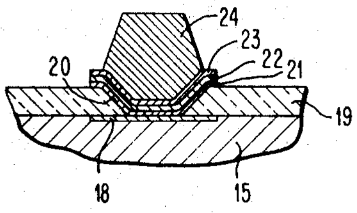
Figure 4:
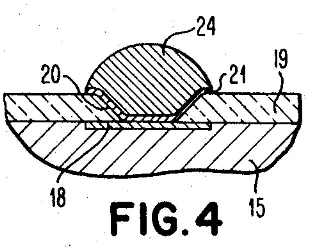
Figure 5:
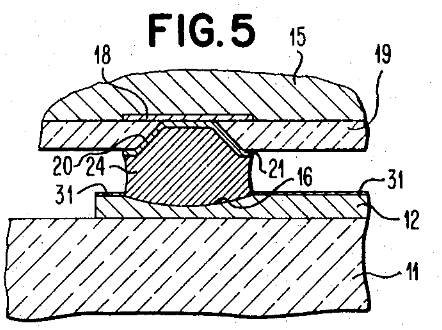

FIGURE 2*a* is an enlarged top view of a portion of the substrate in an area where it is desired to fasten a chip device to the conductive pattern;

FIGURE 3 is a sectional view partially broken away of a chip device with a solder contact in place prior to reflow;

FIGURE 4 is a view of the contact configuration of FIGURE 3 after the contact has been reflowed; and FIGURE 5 is a sectional view of the completed connection.

Figure 1:
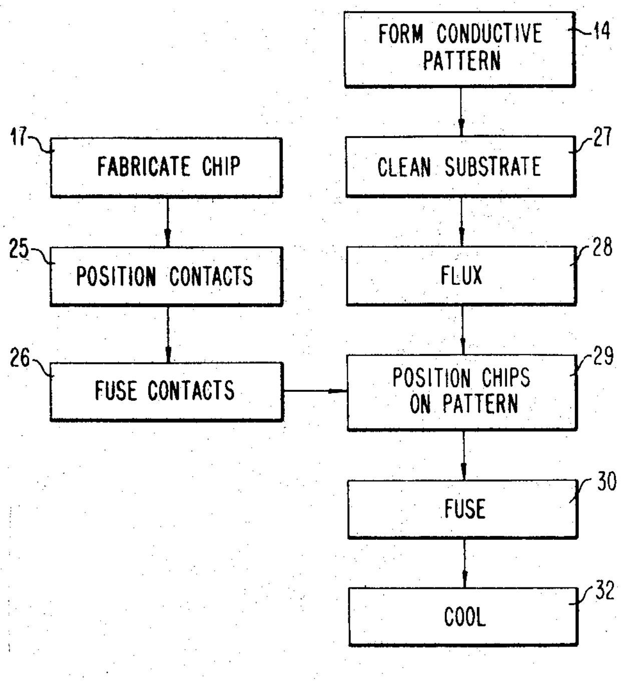
FIGURE 1 is a flow diagram of the operations performed in fastening a microminiature chip device to a conductive pattern formed on a supporting dielectric substrate to form the novel circuit structure of the present invention.

Referring now the drawing, FIGURE 1 indicates the various operations performed in fastening a microminiature chip device to a conductive pattern formed on a supporting dielectric substrate such as illustrated in the remaining figures.

A supporting dielectric substrate 11 shown in FIGURE 2 can be composed of any of the common dielectric materials such as ceramics, glasses, plastics, etc. that can withstand the formation of a conductive pattern 12 thereon and the heat required in the joining step. The substrate is of the order of 0.45" x 0.45" x 0.06" and has terminal members 13 pressed or embedded therein, which provide electrical and mechanical connection to utilization apparatus (not shown).

Returning to FIGURE 1, the first operation in the process is forming a conductive pattern of unique topology on the substrate (Step 14). The pattern 12 (FIGURE 2) is formed by well known techniques, such as photoetching a metal clad printed circuit board, silk screening or otherwise printing a pattern on a substrate after proper preparation of the substrate surface, and the like. Provision is included in the pattern for connecting active or passive microminiature chip devices 15 thereto. To receive the chips, dimples 16 or connecting point (FIGURE 2*a*) may be included in the pattern, the number and grouping being in accordance with the chip to be fastened. The dimples provide a joining plane for the chips and permit the chips to set on the pattern before joining, without tipping. The pattern 12 is also connected to the terminal members 13. It is not necessary, however, to dimple.

A very first requirement for the pattern is that it be of a very high conductivity material, as the pattern has a typical width of 5 to 15 mils or less and a thickness of 0.5 to 1.5 mils. A second requirement is that it be only partially wet by the material of the chip contact. In one embodiment, a copper clad phenolic board was photoetched to provide conductive pattern and supporting dielectric substrate.

Referring now to FIGURE 3, the chip device 15 typically a 25 mil square can be either passive or active in nature. An active chip device is described in a paper entitled "An Approach to Low Cost, High Performance Microelectronics" by E. M. Davis, W. E. Harding and R. S. Schwartz which was presented at the Western Electronics Conference held in San Francisco, Calif., on Aug. 20, 1963. A passive element is described in 5 IBM Technical Disclosure Bulletin No. 10, page 115 (March 1963). One active chip device is a transistor of the planar variety which has been provided with collector, base and emitter portions (not shown) through the operation of well-known diffusion processes. During the fabrication of chip 15 (Step 17) an aluminum land 18 (FIGURE 3) is deposited on each semi-conductor region to provide the desired ohmic contact. Subsequent to the application of the aluminum lands 18, a layer of glass 19 is deposited over the surface of chip 15 to provide environmental protection. Holes 20 are then etched in glass layer 11 directly over the aforesaid aluminum lands 18 to expose them for subsequent metallization steps.

The respective layers of contact metallization at each hole 20 are shown in cross section in FIGURE 3. Succeeding layers of chromium 21, copper 22 and gold 23 are vacuum deposited to provide desired electrical contact to aluminum land 18. Chromium deposit 21 establishes an excellent glass to metal seal and insures environmental protection of the contact area. The copper 22 and gold 23 deposits permit metals to be adhered to chromium sealing film 21.

Subsequently, solder mounts 24 (FIGURE 3) vacuum deposited through a mask are placed in contact with gold layer 23 (Step 25). These built-up contacts 24 which can be of a wide range of shapes aid in the spacing the chip 15 from the substrate 11 while providing good mechanical and electrical interconnection between chip 15 and conductive pattern 12. A wide range of solders can be used to provide the good mechanical and electrical connection, it being additionally necessary that it will only partially wet the conductive pattern 12. One solder found to be suitable is a 97½% lead, 2½% tin which has a melting temperature of the order of 310° C. In the specific geometry shown in FIGURE 3 the contact area has a diameter at its base of approximately 6 mils and the contact is approximately 4.5 mils thick.

After the vacuum deposited solder mounds have been applied to the metallized contact areas, the entire chip is fired to cause the solder to reflow and fill the entire area (Step 26). The effect of the firing step on a contact area is shown in FIGURE 4. The solder mound creates a substantially hemispherical mound due to the fact that the solder does not wet glass layer 19 and is thereby confined to the metallization area. The effect of this firing step also causes the copper and gold layers of metallization 22 and 23 to become absorbed in the upper portion of the solder mound leaving only chromium layer 21 distinctly outlined.

The substrate 11 is next subject to a cleaning operation (Step 27). The cleaning operation is required to ready the substrate for the subsequent operation. To clean, the substrate is placed in a suitable container and covered with a flux remover, typically isopropanol and methyl acetate. Thereafter, the container is placed into a suitable ultrasonic tank for approximately three minutes. The substrate is next placed in a degreasing holder and cleaned for approximately five minutes in a boiling liquid of vapor degreaser.

The pattern 12 thereafter is subjected to a fluxing (Step 28) prior to receiving a chip for joining. The flux serves to establish the proper surface for joining to the contacts 24 of the chip and provides a sticky surface for limiting movement of chip during handling. A number of fluxes have been found to satisfy these criteria. Generally a non-corrosive flux is desired. One flux found to perform satisfactorily is a water white rosin fluid which is applied by brushing, spraying or dipping in a thin layer surrounding the dimples.

An operator next inverts the chips 15 and places them on the dimples 16 (Step 29). The chips 15 stick to the pattern 12 due to the flux applied to the conductive pattern.

A firing operation (Step 30) for fusing the chips to the pattern is next performed. Firing is accomplished by placing the substrate in a conventional non-reducing furnace. Laboratory experimentation has revealed that contact metals of the type described, that is, a 97½% lead, 2½% tin contact, will become molten when substrate temperature reaches 310° C. With passage of time, the weight of the chip and molten state of the contact causes the contact area between mound and pattern to expand only slightly (FIGURE 5). The solder contact only partially wets the pattern with only partial deformation of the contact's original shape, thus preventing complete collapse of the chip onto the pattern. The reasons for this appearance to be as follows. The solder contact's surface tension contributes to the retention of the contact's original shape. Secondly, the solder does not flow readily along the surface of the pattern. Thirdly, as the substrate is being fired, the flux burns off and an oxide layer 31 formed on the surface of the copper pattern, thereby restricting solder flow beyond the original solder pattern contact area. A fourth reason would appear to be from the diffusion of a slight amount of copper into the contact mound once it has become molten, thus raising its melting point temperature. These lattter three reasons would seem to be borne out by the fact that the substrate temperature could be raised to 450° C. without complete chip collapse, that is, without the chip short circuiting to the pattern.

The substrate is cooled (Step 32) at the end of the heating cycle to completely solidify the solder and is then removed from the oven. The copper pattern has a melting temperature well above the firing temperatures and this is not altered during heating and cooling.

The resistance of such joints has been found to be very low which is especially desirable for microelectronic circuits operating in a low voltage environment, typically three volts. The mechanical strength of the joint has been tested at 550 grams (for twenty four contacts of a device in tension) and found to be consistently reliable for loads up to 300 grams. The peak temperature the substrate reached was varied from 300° C. to about 400° C. The optimum reflow conditions were peak temperature 340–360° C. and the contact material in a molten state for approximately two minutes. Resistivity of the pattern is 0.3 ohms per square. In addition, the formation of an oxide layer tends to reduce the rate of migration and increase the voltages necessary to commence migration.

A wide range of materials can be used for the conductive pattern. These include pure copper, electroless copper, beryllium copper, rhodium plated copper, nickel plated copper, a 2% nickel–17% copper–54% iron alloy, electroless nickel plated gold, gold-palladium, gold-platinum and the like.

Similarly, a wide range of solders can be used as the contact material. These include all binary alloys of lead and tin. It will be appreciated, however, that as tin content increases, the temperature at which a contact will collapse decreases. Thus for the same conductive pattern material, firing temperatures must be lowered as tin content increases. Other solders include indium, pure lead, gallium, gold, silver, antimony and their combinations.

The following examples are included merely to aid in the understanding of the invention and variations may be made by one skilled in the art without departing from the spirit of the invention.

EXAMPLE A

A copper clad dielectric substrate such as silicon glass is photoetched to provide a copper conductive pattern 10 mils wide and 1 mil thick on an underlying substrate board. The substrate is placed in a degreasing holder and cleaned for approximately five minutes in a boiling liquid of vapor degreaser. A water white rosin fluid is applied by brushing a thin layer on the pattern prior to receiving a chip for joining. Active chip devices, provided with hemispherically shaped, 97½% lead, 2½% tin solder contacts are inverted and placed, contacts down, on the pattern. The entire assembly is placed in a conventional non-reducing furnace, fired in a standard reflow cycle with peak substrate temperature at 340° C. and contact material in molten state for approximately two minutes. The substrate is cooled to solidify the joint thus providing good mechanical and electrical connection with positive standoff between chip and substrate.

EXAMPLE B

A gold-platinum paste such as Dupont 7553 paste is applied by silk-screening techniques to a 95% alumina dielectric substrate and fired to form a conductive pattern thereon. The pattern is electrolytically or electrolessly plated with nickel. The substrate is placed in a boiling liquid of vapor degreaser. A water white rosin fluid is applied by brushing a thin layer on the pattern prior to receiving a chip for joining. Active chip devices, provided with hemispherically shaped, 97½% lead, 2½% tin solder contacts are inverted and placed in a conventional non-reducing furnace, fired in a standard reflow cycle and cooled as above, thereby providing good mechanical and electrical connection while providing positive standoff between chip and substrate. An evaporated layer of gold deposited on the contact before joining appears to enhance the electrical properties of the connection.

There has thus been described electrical and mechanical interconnection between the terminal areas of a microminiature chip device and connecting areas of a conductive pattern on a supporting dielectric substrate by the provision of contacts extending from the chip device and fused to the connecting areas, while otherwise providing positive standoff between pattern and chip device. It will be apparent from the foregoing description that the ability to form an interconnection without collapse of the chip device against the substrate pattern depends on firing time, temperature and atmosphere, pattern material and solder material. The tendency of the contact material to flow increases with length of firing time, firing temperature and reduction in oxygen in the firing atmosphere. Furthermore, the ability of the contact to retain its shape is a surface tension phenomenon and depends both on the contact material and pattern material used.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A microminiature circuit structure comprising:
- a substrate having a plurality of connecting areas;
- a chip of semiconductive material having a planar face with solder wettable terminal areas;
- solder contacts establishing a unified joint between the terminal areas of said chip and said connecting areas;
- the surface regions of the connecting areas surrounding the unified joints between the terminal areas of said chip and the connecting areas of said substrate being an oxide of the material of said connecting areas formed during joining; and,
- said solder contacts forming the sole means spacing and physically supporting said chip from said substrate.

2. The invention defined by claim 1 wherein said connecting areas comprise one or more noble metals plated with nickel.

3. The invention defined by claim 1 wherein said connecting areas comprise copper.

4. A microminiature circuit structure comprising:
- a dielectric substrate having a conductive electrode pattern thereon;
- said conductive pattern having a plurality of connecting areas;
- a chip of semiconductive material having a planar face with solder wettable terminal areas;
- solder contacts bonding said terminal areas to said connecting areas;
- the surface regions of said conductive pattern surrounding said solder contacts being an oxide of said conductive pattern formed during joining; and,
- said chip being otherwise spaced and physically supported from said substrate solely by means of said solder contacts at said connecting areas.

5. The invention defined by claim 4 wherein said connecting areas comprise one or more noble metals plated with nickel.

6. The invention defined by claim 4 wherein said connecting areas comprise copper.

References Cited

UNITED STATES PATENTS

| | | | |
|---|---|---|---|
| 2,777,192 | 1/1957 | Albright et al. | 29—626 |
| 3,239,719 | 3/1966 | Shower. | |
| 3,373,481 | 3/1968 | Lins et al. | |
| 3,403,438 | 10/1968 | Best et al. | |
| 3,429,040 | 2/1969 | Miller. | |

ROBERT K. SCHAFER, Primary Examiner

D. SMITH, Jr., Assistant Examiner

U.S. Cl. X.R.

317—234